(12) United States Patent
Stranzl et al.

(10) Patent No.: US 9,257,342 B2
(45) Date of Patent: Feb. 9, 2016

(54) METHODS OF SINGULATING SUBSTRATES TO FORM SEMICONDUCTOR DEVICES USING DUMMY MATERIAL

(71) Applicant: Infineon Technologies AG, Neubiberg (DE)

(72) Inventors: Gudrun Stranzl, Goedersdorf (AT); Martin Zgaga, Rosegg (AT); Markus Kahn, Rangersdorf (AT); Guenter Denifl, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/260,903

(22) Filed: Apr. 24, 2014

(65) Prior Publication Data

US 2014/0235035 A1 Aug. 21, 2014

Related U.S. Application Data

(62) Division of application No. 13/452,484, filed on Apr. 20, 2012, now Pat. No. 8,748,297.

(51) Int. Cl.
*H01L 21/82* (2006.01)
*H01L 21/78* (2006.01)
*H01L 21/8258* (2006.01)
*H01L 21/308* (2006.01)

(52) U.S. Cl.
CPC .............. *H01L 21/82* (2013.01); *H01L 21/78* (2013.01); *H01L 21/8258* (2013.01); *H01L 21/308* (2013.01)

(58) Field of Classification Search
CPC ......................... H01L 21/82; H01L 21/8258
See application file for complete search history.

(56) References Cited

U.S. PATENT DOCUMENTS

| | | |
|---|---|---|
| 4,064,620 A | 12/1977 | Lee et al. |
| 5,674,355 A | 10/1997 | Cohen et al. |
| 5,801,082 A | 9/1998 | Tseng |
| 6,153,010 A | 11/2000 | Kiyoku et al. |
| 6,255,198 B1 | 7/2001 | Linthicum et al. |
| 6,255,712 B1 | 7/2001 | Clevenger et al. |
| 6,528,732 B1 | 3/2003 | Okubora et al. |
| 6,541,352 B2 * | 4/2003 | Wachtler ............... 438/460 |
| 6,969,669 B2 | 11/2005 | Arita |
| 7,399,712 B1 | 7/2008 | Graff |
| 7,629,228 B2 | 12/2009 | Haji et al. |

(Continued)

FOREIGN PATENT DOCUMENTS

| | | |
|---|---|---|
| EP | 0884767 A3 | 1/2000 |
| EP | 1758171 A1 | 2/2007 |

(Continued)

OTHER PUBLICATIONS

Kawana, D., et al., Bilayer Resist for Sub-65 nm Lithography Semiconductor International, www.semiconductor.net, Feb. 2006, 4 pages.

(Continued)

*Primary Examiner* — Allen Parker
(74) *Attorney, Agent, or Firm* — Slater & Matsil, L.L.P.

(57) ABSTRACT

In one embodiment, a method of forming a semiconductor device includes forming openings in a substrate. The method includes forming a dummy fill material within the openings and thinning the substrate to expose the dummy fill material. The dummy fill material is removed.

22 Claims, 16 Drawing Sheets

(56) References Cited

U.S. PATENT DOCUMENTS

| | | |
|---|---|---|
| 7,767,551 B2 | 8/2010 | Arita et al. |
| 7,803,717 B2 | 9/2010 | Rawdanowicz et al. |
| 7,994,026 B2 | 8/2011 | Harikai et al. |
| 8,026,181 B2 | 9/2011 | Arita et al. |
| 2003/0013233 A1 | 1/2003 | Shibata |
| 2004/0102025 A1 | 5/2004 | Arita |
| 2008/0064215 A1 | 3/2008 | Na et al. |
| 2008/0230911 A1 | 9/2008 | Li |
| 2008/0254639 A1 | 10/2008 | Graff |
| 2009/0209087 A1 | 8/2009 | Arita |
| 2010/0009518 A1 | 1/2010 | Wu et al. |
| 2010/0019279 A1 | 1/2010 | Chen et al. |
| 2010/0022071 A1 | 1/2010 | Arita et al. |
| 2010/0048001 A1 | 2/2010 | Harikai et al. |
| 2010/0072579 A1 | 3/2010 | Thies et al. |
| 2010/0078771 A1 | 4/2010 | Barth et al. |
| 2010/0136784 A1 | 6/2010 | Mebarki et al. |
| 2010/0173474 A1 | 7/2010 | Arita et al. |
| 2011/0309479 A1 | 12/2011 | Engelhardt |
| 2012/0015522 A1 | 1/2012 | Arita et al. |
| 2012/0021608 A1 | 1/2012 | Arita et al. |
| 2012/0038034 A1 | 2/2012 | Shin et al. |
| 2013/0026489 A1 | 1/2013 | Gambin et al. |
| 2013/0175614 A1 | 7/2013 | Na |

FOREIGN PATENT DOCUMENTS

| | | | |
|---|---|---|---|
| WO | 0031783 | A1 | 6/2000 |
| WO | 2004042783 | A2 | 5/2004 |
| WO | 2013001014 | A1 | 1/2013 |
| WO | 2013036376 | A2 | 3/2013 |

OTHER PUBLICATIONS

Oh, K. S., et al., Formation and Characteristics of Fluorinated Amorphous Carbon Films Deposited by CF4/CH4 ICPCVD, Journal of Korean Physical Society, vol. 39, No. 2, Aug. 2001, pp. 291-295.

Robertson, J., Materials Science and Engineering R 37, 2002, 1 page.

Roy, M. R., Surface Properties of Hard Fluorinated Amorphous Carbon Films Deposited by Pulsed-DC Discharges University of Barcelona, Doctoral Thesis, Jan. 18, 2010, 185 pages.

Armitage, R., et al., "Lattice-matched HfN buffer layers for epitaxy of GaN on Si," Applied Physics Letters, vol. 81, No. 8, Aug. 19, 2002, pp. 1450-1452.

Brown, J.D., et al., "AlGaN/GaN HFETs fabricated on 100-mm GaN on silicon (111) substrates," Solid-State Electronics 46, Pergamon, Feb. 19, 2002, pp. 1535-1539.

Chowdhury, I., et al., "High growth rate 4H-SiC epitaxial growth using dichlorosilane in a hot-wall CVD reactor," Materials Science, Nov. 4, 2010, 30 pages.

Chumbes, E. M., et al., "AlGaN/GaN High Electron Mobility Transistors on Si(111) Substrates," IEEE Transactions on Electron Devices, vol. 48, No. 3, Mar. 2001, pp. 420-426.

Chyurlia, P. N., et al., "Monolithic integration of AlGaN/GaN HFET with MOS on silicon <111substrates," Electronics Letters, 46, 3, NRC Publications Archive, Feb. 4, 2010, 3 pages.

Honda, Y., et al., "Growth of GaN free from cracks on a (111) Si substrate by selective metalorganic vapor-phase epitaxy," Applied Physics Letters, vol. 80, No. 2, Jan. 14, 2002, pp. 222-224.

Jamil, M., et al., "Development of strain reduced GaN on Si (111) by substrate engineering," Applied Physics Letter 87, Aug. 17, 2005, 3 pages.

Jia, S., et al., "AlGaN-GaN HEMTs on Patterned Silicon (111) Substrate," IEEE Electron Device Letter, vol. 26, No. 3, Mar. 2005, pp. 130-132.

La Via, F., "Silicon Carbide Epitaxy," Research Signpost, 2012, 262 pages.

Liu, W., et al., "Influence of the AlN interlayer crystal quality on the strain evolution of GaN layer grown o Si (111)," Applied Physics Letters 90, Jan. 5, 2007, 3 pages.

Paisley, M.J., et al., "Growth of cubic phase gallium nitride by modified molecular-beam epitaxy," Department of Materials Science and Engineering, North Carolina State University, Nov. 14, 1988, pp. 701-705.

Powell, J. A., et al., "Growth of step-free surfaces on device-size (0001)SiC mesas," Applied Physics Letters, vol. 77, No. 10, Sep. 4, 2000, pp. 1449-1451.

Rajagopal, P., et al., "Large-Area, Device Quality GaN on Si Using a Novel Transition Layer Scheme," Materials Research Society, 2002 MRS Fall Meeting, vol. 743, 6 pages.

Wu, C., et al., "Heteroepitaxy of GaN on Si(111) realized with coincident-interface AlN/B-Si3N4(0001) double-buffer structure," Applied Physics Letters, vol. 83, No. 22, Dec. 1, 2003, pp. 4530-4532.

\* cited by examiner

METHODS OF SINGULATING SUBSTRATES TO FORM SEMICONDUCTOR DEVICES USING DUMMY MATERIAL

This application is a divisional of application Ser. No. 13/452,484 filed on Apr. 20, 2012, which is hereby incorporated by reference.

TECHNICAL FIELD

The present invention relates generally to semiconductor devices, and more particularly to methods of forming semiconductor devices.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of materials over the semiconductor wafers, patterning the thin films of material, doping selective regions of the semiconductor wafers, and other processes.

In a conventional semiconductor fabrication process, a large number of semiconductor devices are fabricated within and/or over a single wafer. After completion of device level and interconnect level fabrication processes, the semiconductor devices within the wafer are separated. For example, the wafer may undergo singulation. During singulation, the wafer is treated, e.g., mechanically, and the semiconductor devices are physically separated to form individual dies. Purely mechanical separation is not space efficient compared to chemical processes. However, chemical separation of small sized dies requires overcoming many difficult process issues.

SUMMARY OF THE INVENTION

These and other problems are generally solved or circumvented, and technical advantages are generally achieved, by illustrative embodiments of the present invention.

In one embodiment, a method of forming a semiconductor device includes forming openings in a substrate. The method includes forming a dummy fill material within the openings and thinning the substrate to expose the dummy fill material. The dummy fill material is removed.

In an alternative embodiment, a method of forming a semiconductor device comprises providing a substrate comprising openings. The dummy fill material is disposed within the openings. The method further comprises thinning the substrate to expose the dummy fill material, and singulating the substrate by removing the dummy fill material.

In an alternative embodiment, a method of forming a semiconductor device comprises forming a plurality of active elements in a semiconductor substrate and forming metallization over the plurality of active elements to form a plurality of devices. The method further comprises forming openings in the substrate, the openings surrounding each of the plurality of devices, and forming a dummy plug within the openings.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Chip Scale Packages (CSPs) are used for packing small components such as diodes, transistors, and others. CSPs typically have an area no greater than 1.2 times that of the die and are usually a single-die, direct surface mountable package. For example, die sizes may be vary between about 0.05 $mm^2$ to about 50 $mm^2$. Because of the small sized dies, each wafer yields many thousand units. For example, an 8-inch wafer can yield up to 200,000 to 600,000 dies. Assembly of such small sized dies may be performed after fabrication in a different or same facility by picking up loose dies, for example, using a special pick up process like "ball feed" method. However, embodiments of the invention may be applied to any type of package and is not constrained to any particular package.

For small sized dies, substantial amount of real estate on the silicon wafer may be lost to dicing streets, which are regions that separate adjacent dies. Therefore, methods of forming small semiconductor dies are needed using narrow dicing streets. Narrow dicing streets may be enabled by the use of chemical and/or plasma etching processes. However, chemical etching processes cannot practically (within a reasonable time) etch through the complete wafer. Therefore, a combination of mechanical and chemical processes has to be used in dicing a wafer into a plurality of semiconductor dies. However, such methods require overcoming the problems associated with stabilizing a thin wafer during a thinning or grinding process. Wafer separated by plasma dicing end up forming separated dies that have to be picked up individually increasing processing times and costs. Embodiments of the invention overcome these and other problems to enable dicing of semiconductor wafer into dies. In various embodiments, a dummy fill material is used to prevent adhesive materials from getting between sidewalls of adjacent dies after plasma dicing thereby avoiding problems with removing a thick adhesive layer along the sidewalls of the dies. Advantageously, embodiments of the invention form diced dies that placed on a tape without additional die picking and placing.

A method of forming a plurality of semiconductor dies in accordance with various embodiments of the invention will be described using FIGS. 1-12. Alternative methods of forming the plurality of semiconductor dies will be described using FIGS. 13-15, FIGS. 16-17, FIGS. 18-26, and FIGS. 27-28.

FIGS. 1-12 illustrate a cross-sectional view of a semiconductor device during various stages of fabrication in accordance with an embodiment of the invention.

Figure 1A:
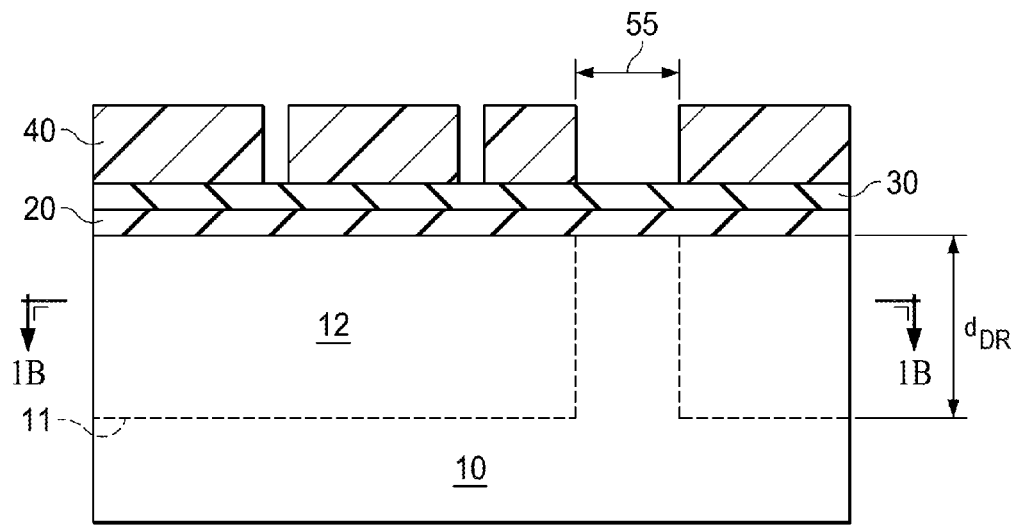
FIGS. 1A-12 illustrate a cross-sectional view of a semiconductor device during various stages of fabrication in accordance with an embodiment of the invention.
Figure 1B:
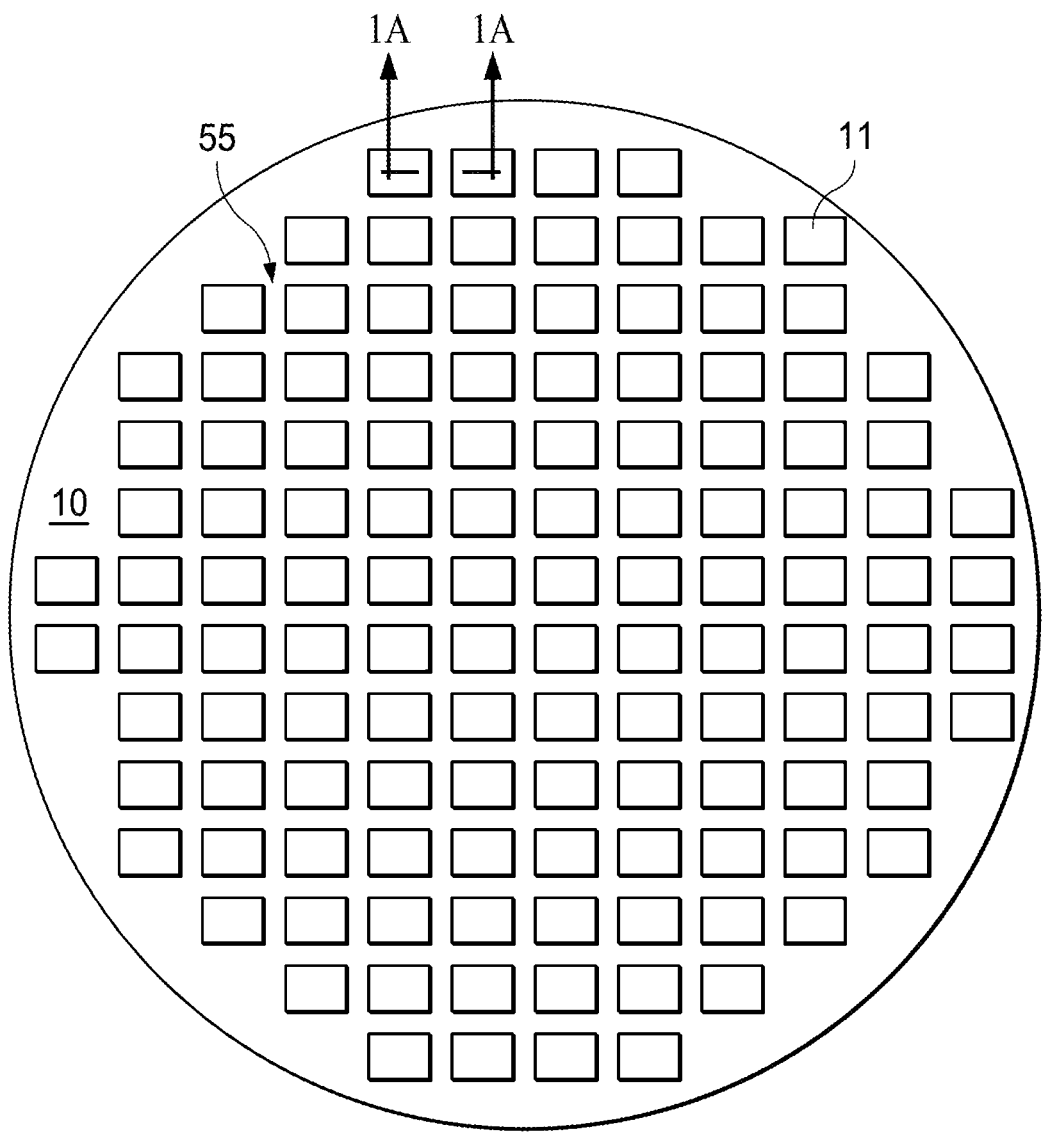

FIG. 1, which includes FIGS. 1A and 1B, illustrates a semiconductor device after completion of front end and back end processing in accordance with an embodiment of the invention, wherein FIG. 1A illustrates a cross-sectional view and FIG. 1B illustrates a top view.

FIG. 1A illustrates a substrate 10 having a plurality of dies 11 after all front end and back end processing. Front end processing refers to the formation of active device regions while back end processing refers to the formation of metallization layers to interconnect the various devices of the integrated circuit. In other words, the substrate 10 may be a processed wafer having a plurality of dies 11 including metallization formed therein. For example, in one or more embodiments, the substrate 10 comprises a wafer having an array of dies on a front side.

In various embodiments, the substrate 10 may be silicon alloys and compound semiconductors. The substrate 10 may be a wafer and may include epitaxial layers in various embodiments. In one or more embodiments, the substrate 10 may be a bulk silicon wafer or a silicon-on-insulator wafer. In some embodiments, the substrate 10 may be an III-V substrate with elements from Group III and Group V, or the substrate 10 may be an II-VI substrate with elements from Group II and Group VI. In one or more embodiments, the substrate 10 may be a silicon-on-sapphire (SOS) substrate. In one or more embodiments, the substrate 10 may be a germanium-on-insulator (GeOI) substrate. In one or more embodiments, the substrate 10 may include one or more semiconductor materials such as silicon, silicon germanium, silicon carbon, germanium, gallium arsenide, indium arsenide, indium arsenide, gallium nitride, indium gallium arsenide, or indium antimonide.

The plurality of dies 11 may comprise different type of dies including integrated circuits or discrete devices. In one or more embodiments, the plurality of dies 11 in the substrate 10 may comprise logic chips, memory chips, analog chips, mixed signal chips, and combinations thereof such as system on chip. The plurality of dies 11 may comprise various types of active and passive devices such as diodes, transistors, thyristors, capacitors, inductors, resistors, optoelectronic devices, sensors, microelectromechanical systems, and others. In one embodiment, the substrate 10 comprises a plurality of dies 11, each die being a discrete device such as a single transistor. Examples of discrete devices include power devices, vertical devices (current flowing from top to bottom), and others.

Referring to FIG. 1A, device regions 12 are disposed within the substrate 10. The device regions 12 may include doped regions in various embodiments. Further, some portion of the device regions 12 may be formed over the substrate 10. The device regions 12 may include the active regions such as channel regions of transistors.

The substrate 10 comprises a top surface and an opposite bottom surface. In various embodiments, the active devices are formed closer to the top surface of the substrate 10 than the bottom surface. The active devices are formed in the device regions 12 of the substrate 10. The device regions 12 extends over a depth $d_{DR}$, which depending on the device, is about 50 µm to about 500 µm, and about 200 µm in one embodiment. Further, a final depth of the plurality of dies 11 will be determined after substrate thinning as will be described subsequently. The bottom surface of the device regions 12 is therefore shown as dashed lines.

Referring to FIG. 1A, after forming the active regions within the substrate 10, metallization layers may be formed. In various embodiments, all necessary interconnects, connections, pads etc. for coupling between devices and/or with external circuitry are formed over the substrate 10.

A first insulating layer 20 is formed over the substrate 10. The first insulating layer 20 may be grown (e.g., by oxidation, nitridation, combination thereof, etc.), deposited, for example, using chemical vapor deposition (CVD), atomic layer deposition (ALD), metal organic chemical vapor deposition (MOCVD), physical vapor deposition (PVD), or jet vapor deposition (JVD), as examples.

The first insulating layer 20 may comprise an oxide in one embodiment. In various embodiments, the first insulating layer 20 may comprise insulating materials typically used in semiconductor manufacturing for inter-level dielectric layers, such as $SiO_2$, tetra ethyl oxysilane (TEOS), fluorinated TEOS (FTEOS), doped glass (borophosphosilicate glass (BPSG), phosphosilicate glass (PSG), borosilicate glass (BSG)), organo silicate glass (OSG), fluorinated silicate glass (FSG), spin-on glass (SOG), SiN, SiON, or low-k insulating materials such as SiCOH. The first insulating layer 20 may comprise a thickness of about 500 nm or less in various embodiments. In one embodiment, the first insulating layer 20 comprises a thickness of about 5 nm to about 50 nm. In another embodiment, the first insulating layer 20 comprises a thickness of about 10 nm to about 100 nm. In another embodiment, the first insulating layer 20 comprises a thickness of about 50 nm to about 200 nm. In one embodiment, the first insulating layer 20 comprises a thickness of about 100 nm to about 300 nm.

A second insulating layer 30 may be deposited over the first insulating layer 20. In one or more embodiments, the second insulating layer 30 comprises a doped glass such as BPSG, PSG, and BSG. The doped glass may be coated using spin coating in one or more embodiments. The spin on glass may be deposited as a liquid or a semi solid so that features over the substrate 10 are planarized. After depositing the doped glass, a bake and cure may be used to form the second insulating layer 30. In one embodiment, the second insulating layer 30 comprises a thickness of about 5 nm to about 50 nm. In another embodiment, the second insulating layer 30 comprises a thickness of about 10 nm to about 100 nm. In another embodiment, the second insulating layer 30 comprises a thickness of about 50 nm to about 200 nm. In one embodiment, the second insulating layer 30 comprises a thickness of about 100 nm to about 300 nm.

A first resist 40 is deposited over the second insulating layer 30 and patterned, for example, using conventional lithography. The first resist 40 may comprise a single resist layer, or a multi-layer resist such as a bi-layer resist layer or a tri-layer resist. As an example, a tri-layer resist stack may comprise three layers: a thick bottom resist layer over the second insulating layer 30, a middle resist layer over the bottom resist layer, and a top resist layer on top of the middle resist layer. For example, the top resist layer may be a patternable resist. The middle resist layer may, for example, be a material such as an anti-reflective coating (ARC) with high silicon content (Si BARC Si content>30 wt %). The Si BARC material typically comprises a $SiO_xC_y(N_y)$ type compound, although other suitable anti-reflective material may be used in case certain etch selectivity requirements are met. The ARC is used to block reflected radiation from the underlying layers. The reflected radiation from these underlying layers may result in additional interference patterns and result in line width variations in the top resist layer exposed to radiation. The bottom resist layer may be a hard baked organic dielectric layer (ODL). The top resist layer functions as mask for etching the middle resist layer which functions, besides its role as reflection suppressant, as the masking material for etching the comparatively thicker bottom resist layer. A top ARC layer is formed over the top layer. The formation of the resist layer may include bakes or anneals after deposition of each layer.

FIG. 1B illustrates a top view of the substrate 10 comprising a plurality of dies 11. Each die 11 is separated from each other by a plurality of regions called kerf 55 (also called as scribe lines or dicing channels). The kerf 55 may comprise additional circuitry or other structures, which may be used for testing.

Figure 2:
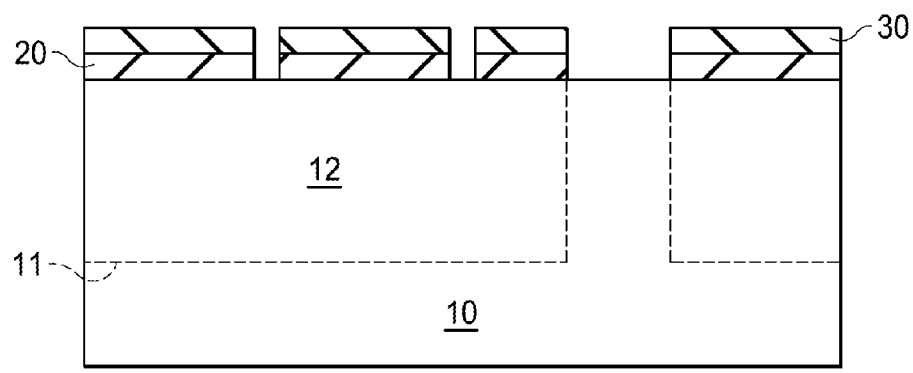

Referring to FIG. 2, the second insulating layer 30 and the first insulating layer 20 are etched using the first resist 40 as the etch mask. In one or more embodiments, an anisotropic etching such as reactive ion etching may be used. After patterning the first and the second insulating layers 20 and 30, any remaining portion of the first resist 40 may be removed in some embodiments.

Figure 3:
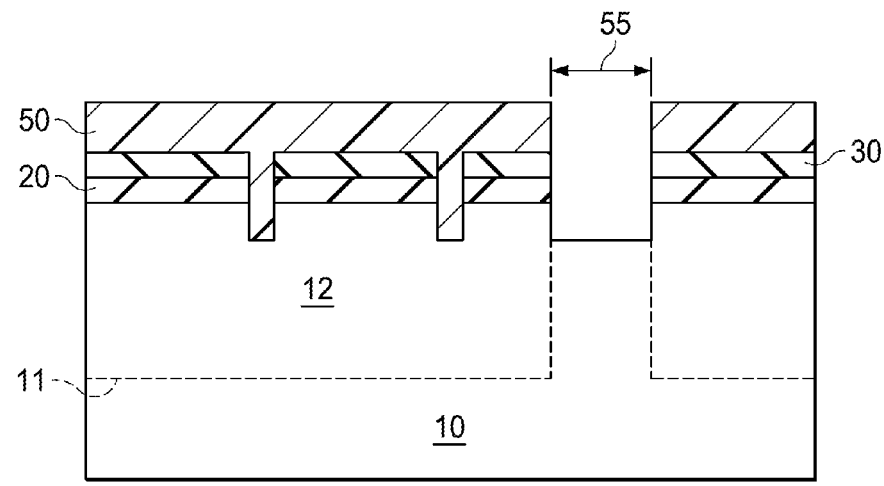

Referring to FIG. 3, using the patterned first and the second insulating layers 20 and 30 as an etch mask, the substrate 10 is etched. In one or more embodiments, the substrate 10 is etched using an anisotropic etching such as reactive ion etching. After etching the substrate 10, any remaining portion of the first resist 40 is removed.

A second resist 50 is deposited over the substrate 10 and patterned to open the kerf 55. Kerf 55 separates adjacent dies 11 on a substrate 10. Kerf 55 may be also referred as dicing street or dicing channel. The second resist 50 may comprise a single layer or a multi-layer resist in various embodiments. In one embodiment, the second resist 50 may comprise a hard mask underlying a photo resist film. The hard mask may comprise an inorganic dielectric layer such a silicon nitride layer in various embodiments.

Figure 4A:
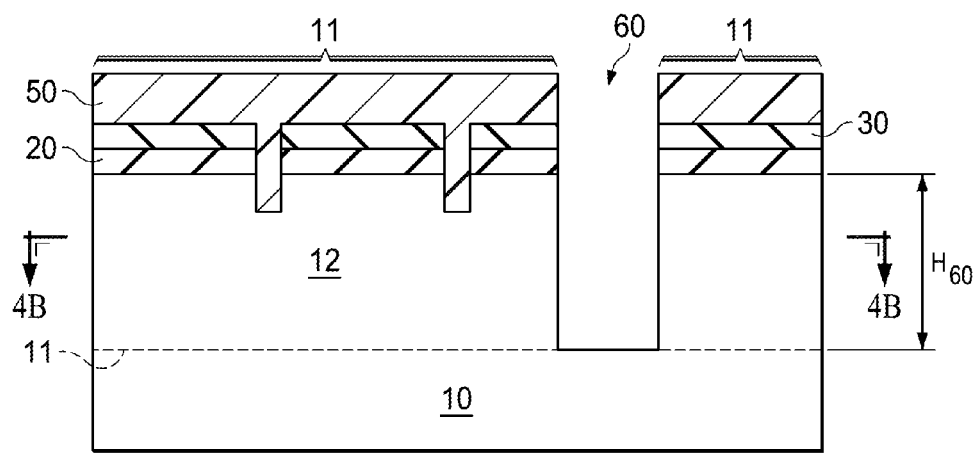
Figure 4B:
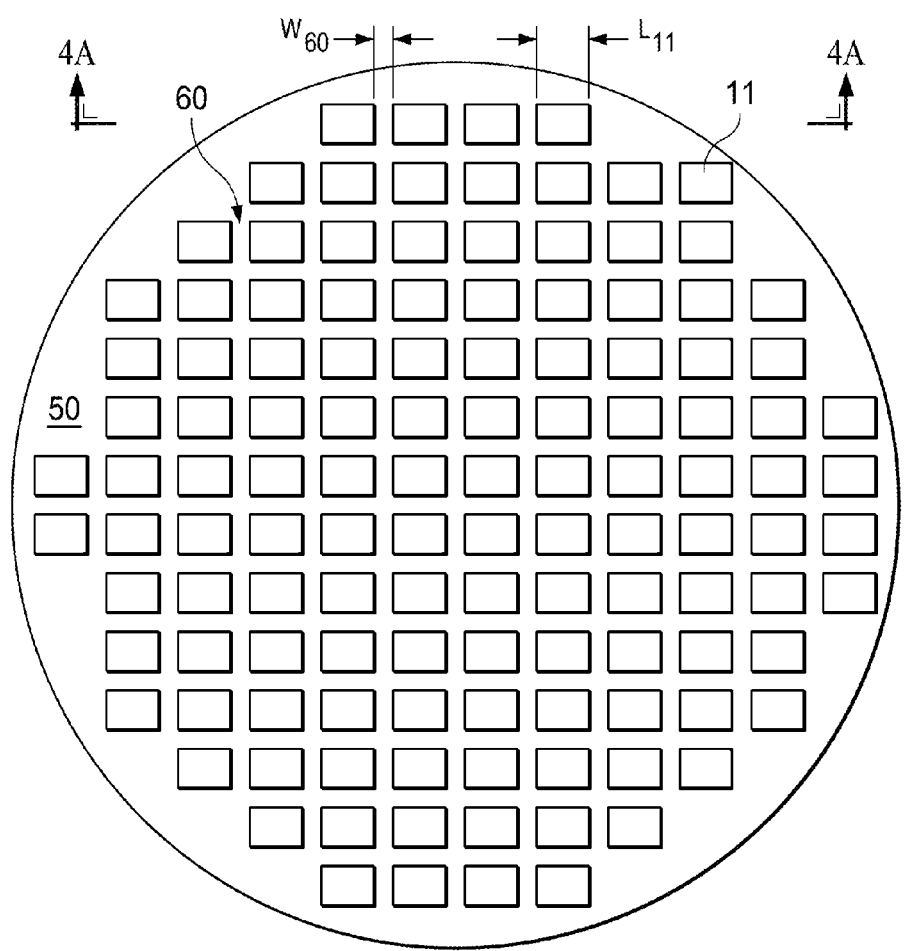

FIG. 4, which includes FIGS. 4A and 4B, illustrates the semiconductor device after the formation of a kerf opening in accordance with embodiments of the invention, wherein FIG. 4A illustrates a cross-sectional view and FIG. 4B illustrates a top cross-sectional view. Referring to FIG. 4A, the kerf 55 is etched to form a kerf opening 60. The kerf opening 60 follows the kerf between adjacent dies as illustrated in a top view of FIG. 4B and therefore comprises mesh shaped openings over the substrate 10.

In various embodiments, the kerf openings 60 are formed using a plasma dicing process. In various embodiments, the kerf openings 60 may be formed using chemical etching processes such as deep reactive ion etching after a masking process to form a hard mask. In various embodiments, the kerf openings 60 may be formed using a Bosch Process or by depositing a hard mask layer and etching through the stacked wafers using a vertical reactive ion etch.

In the Bosch process, etching and deposition are alternatively performed and may be repeated many times. In a first step, a plasma etch is used to vertically etch an opening while in a second step a passivation layer is deposited so as to prevent widening of the opening in regions already etched. The plasma etch is configured to etch vertically, e.g., using sulfur hexafluoride [SF6] in the plasma. The passivation layer is deposited, for example, using octa-fluoro-cyclobutane as a source gas. Each individual step may be turned on for a few seconds or less. The passivation layer protects the substrate 10 so as to prevent lateral etching. However, during the plasma etching phase, the directional ions that bombard the substrate 10 remove the passivation layer at the bottom of the opening being formed (but not along the sides) and etching continues. The Bosch process may produce sidewalls that are scalloped.

The kerf openings 60 may also be formed using other processes such as using a laser. In some embodiments, mechanical processes may also be used to form the kerf openings 60. However, chemical processes may be used especially when the aspect ratios of the kerf openings 60 is large.

The kerf openings 60 are formed along the kerf 55. As illustrated in FIG. 4A, after the partial dicing, the height $H_{60}$ of the kerf openings 60 is about 50 μm to about 500 μm, and about 200 μm in one embodiment. As illustrated in FIG. 4B, the width $W_{60}$ of the kerf openings 60 is about 10 μm to about 50 μm, and about 20 μm in one embodiment. The length $L_{11}$ of the die 11 is about 200 μm to about 10 mm, and about 300 μm in one embodiment. The ratio of the height $H_{60}$ of the kerf openings 60 to the length $L_{11}$ of the die 11 is about 2.5:1 (small chip area) to about 1:20 (large chip area).

Figure 5:
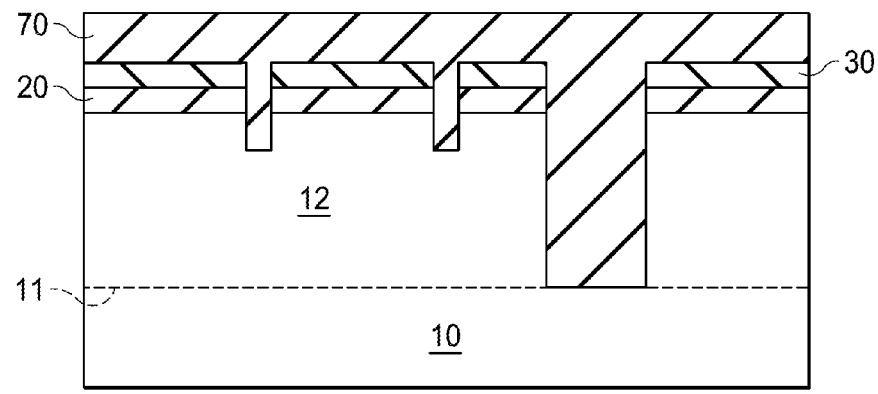

FIG. 5 illustrates the semiconductor device after filling the kerf openings and contact openings with a dummy mask material in accordance with embodiments of the invention.

As illustrated in FIG. 5, the second resist 50 is removed after forming the kerf openings 60 and a dummy fill material 70 is deposited. The dummy fill material 70 may be coated in some embodiments thereby forming a planarized layer. Alternatively, the dummy fill material 70 may be planarized forming a planar top surface. In one embodiment a thin carbon based layer is deposited on the inner walls of the kerf openings 60.

In various embodiments, the dummy fill material 70 may comprise different types of carbon morphologies such as amorphous, nanostructured, or polycrystalline, which may be nanocrystalline. In various embodiments, amorphous carbon may be hydrogenated amorphous carbon. In alternative embodiments, amorphous carbon may be tetrahedral amorphous carbon, or a mixture comprising tetrahedral and hydrogenated amorphous carbon. In one case, a nanostructured carbon may comprise crystalline carbon clusters in an amorphous carbon matrix, i.e., a carbon nanocomposite. Such crystalline carbon clusters may be polycrystalline and may have a few carbon atoms (e.g., 10) to about a few thousand carbon atoms, e.g., 1000, in various embodiments. In various embodiments, polycrystalline carbon may comprise grains from about a few tenth of a nanometer to about a few thousand nanometers. In one embodiment, the polycrystalline carbon may comprise grains of about 0.5 nm to about 10 nm and may be nanocrystalline. In various embodiments, the carbon morphology of the dummy fill material 70 may comprise $sp^3$, $sp^2$, and/or sp hybridized carbon atoms.

In one or more embodiments, the dummy fill material 70 comprises an alloy of silicon and carbon. In another embodiment, the dummy fill material 70 comprises amorphous carbon with negligible silicon. In one or more embodiments, an atomic fraction of carbon in the dummy fill material 70 is at least 90%. In another embodiment, an atomic fraction of carbon in the dummy fill material 70 is at least 99%. In alternative embodiments, the dummy fill material 70 may comprise fluorinated carbon.

The dummy fill material 70 may be deposited using chemical or physical vapor deposition or spin coating, for example, low pressure chemical vapor deposition (LPCVD), plasma enhanced chemical vapor deposition (PECVD), high density plasma vapor deposition or other vapor deposition in various embodiments. In one embodiment, a PECVD process is used to grow the various carbon morphologies described above.

In one embodiment, fluorinated carbon may be deposited using precursors which contain carbon and fluorine. In an alternative embodiment, fluorinated carbon may be deposited using fluorine-carbon containing precursors (e.g., $SF_6$, $CF_4$, $CHF_3$ etc.). In yet another alternative embodiment, fluorinated carbon may be deposited using a mixture of carbon containing precursors (e.g., $C_2H_2$ etc.) and fluorine containing precursors.

In various embodiments, the carbon layer may be fluorine, iron, or aluminum terminated so that the carbon layer which is hydrophilic becomes more hydrophobic. For example, water contact angle of carbon layer ranges from about 55° to about 70°, which may be increased to up to 120° using surface treatment techniques in some embodiments. In one embodiment, a thin carbon based layer on the inner walls of the kerf openings 60 could be terminated by fluorine resulting in a super hydrophobic surface. In one embodiment, such a super hydrophobic surface may be formed by exposing the dummy fill material 70 (or the thin carbon based layer) to a fluorine plasma.

Figure 6:
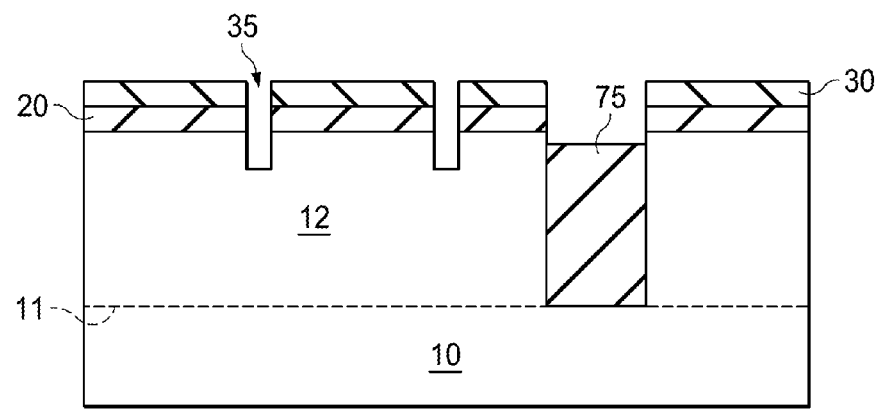

Referring to FIG. 6, the dummy fill material 70 is etched to form a dummy plug 75. Excess dummy fill material 70 is removed from over the first and the second insulating layers 20 and 30 as illustrated so as to form the dummy plug 75. After the formation of the dummy plug 75, the dummy fill material 70 filling the contact openings 35 is also removed. In one embodiment, the top surface of the dummy plug 75 is coplanar with the top surface of the substrate 10.

Figure 7:
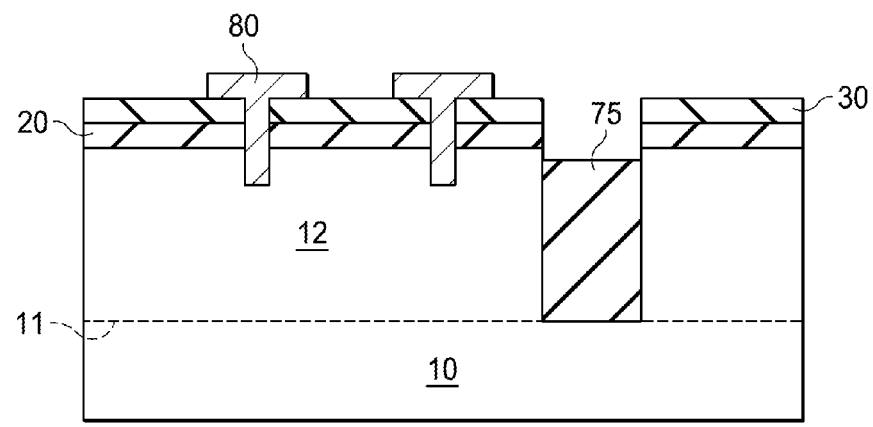

Referring next to FIG. 7, contact plugs 80 are formed within the contact openings 35. The contact plugs 80 may be formed using a subtractive etch in one embodiment. For example, the contact plugs 80 may be formed by depositing a blanket layer followed by a patterning process, e.g., using lithography. Such a subtractive etch may be used in forming contact plugs 80 made of aluminum. In an alternative embodiment, the contact plugs 80 may be formed from copper. In such an embodiment, a damascene process may be used wherein copper is deposited selectively. In various embodiments, the contact plugs 80 may comprise tungsten, titanium, tantalum, nickel, cobalt, platinum, silver, gold, lead, conductive nitrides thereof and other suitable conductive materials.

Figure 8:
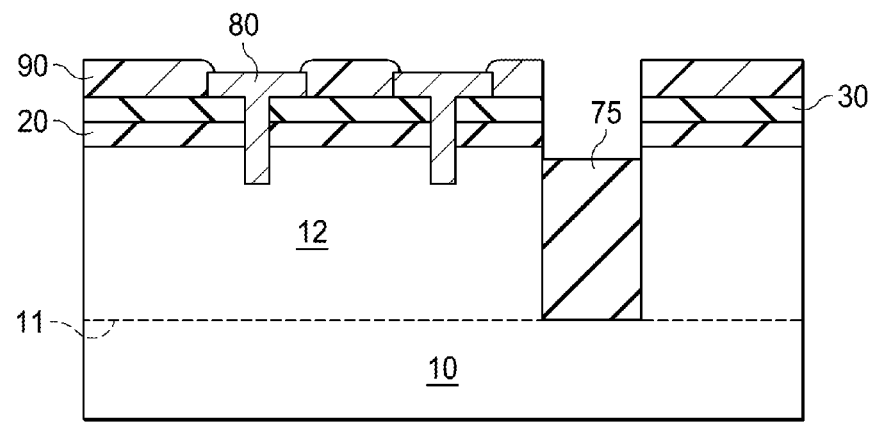

FIG. 8 illustrates the semiconductor device after the formation of a passivation layer in accordance with embodiments of the invention.

A passivation layer 90 may be deposited over the second insulating layer 30. In various embodiments, the passivation layer 90 is patterned to enclose contact pads on the contact plugs 80. In various embodiments, the passivation layer 90 may comprise an oxide, a nitride, a polyimide, or other suitable materials known to one skilled in the art. The passivation layer 90 may comprise a hard mask in one embodiment, and a resist mask in another embodiment. The passivation layer 90 helps to protect the metallization including the contact plugs 80 and the device regions during subsequent processing.

Figure 9:
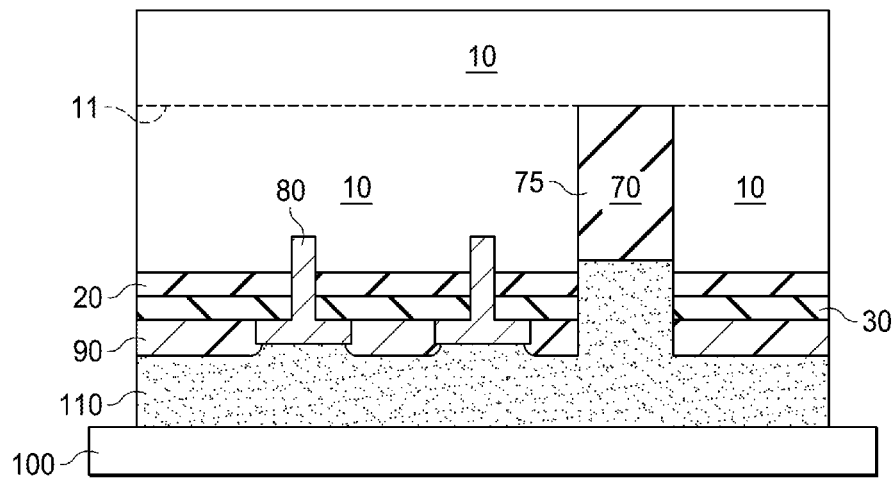

FIG. 9 illustrates the semiconductor device after placing the substrate over a carrier in accordance with embodiments of the invention.

Referring to FIG. 9, the substrate 10 is attached to a carrier 100. The passivation layer 90 is coated with an adhesive 110 and the carrier 100 is thereby attached.

The adhesive 110 may comprise any suitable adhesive material in various embodiments. The viscous nature of the adhesive 110 allows it to flow along the sidewalls of the kerf openings 60. However, the dummy plug 75 prevents the adhesive 110 from getting deeper into the kerf openings 60. In the absence of the dummy plug 75 protecting the kerf openings 60, the adhesive 110 will flow into the kerf openings 60 and may be difficult to remove subsequently.

Further, in some embodiments, a primer coating may be applied prior to coating the adhesive 110. The primer coating is tuned to react with the surface of the passivation layer 90 and the sidewalls of the kerf openings 60 and convert potentially high surface energy surfaces to lower surface energy surfaces by forming a primer layer. Thus, the adhesive 110 interacts only with the primer layer improving the bonding.

The adhesive 110 may comprise an organic compound such as an epoxy based compound in one or more embodiments. In various embodiments, the adhesive 110 comprises an acrylic based, not photoactive, organic glue. In another embodiment, the adhesive 110 comprises SU-8, which is a negative tone epoxy based photo resist.

In alternative embodiments, the adhesive 110 may comprise a molding compound. In one embodiment, the adhesive 110 comprises an imide and/or components such a polymethyl-methacrylate (PMMA) used in forming a poly-imide. In another embodiment, the adhesive 110 comprises components for forming an epoxy-based resin or co-polymer and may include components for a solid-phase epoxy resin and a liquid-phase epoxy resin. Embodiments of the invention also include combinations of different type of adhesive components and non-adhesive components such as combinations of acrylic base organic glue, SU-8, imide, epoxy-based resins etc.

In various embodiments, the adhesive 110 comprises less than about 1% inorganic material, and about 0.1% to about 1% inorganic material in one embodiment. The absence of inorganic content improves the removal of the adhesive 110 without leaving residues.

In one or more embodiments, the adhesive 110 may comprise thermosetting resins, which may be cured by annealing at an elevated temperature. Alternatively, in some embodiments, a low temperature anneal or bake may be performed to cure the adhesive 110 so that adhesive bonding between the carrier 100 and the adhesive 110 and between the adhesive 110 and the substrate 10 is formed. Some embodiments may not require any additional heating and may be cured at room temperature.

Figure 10:
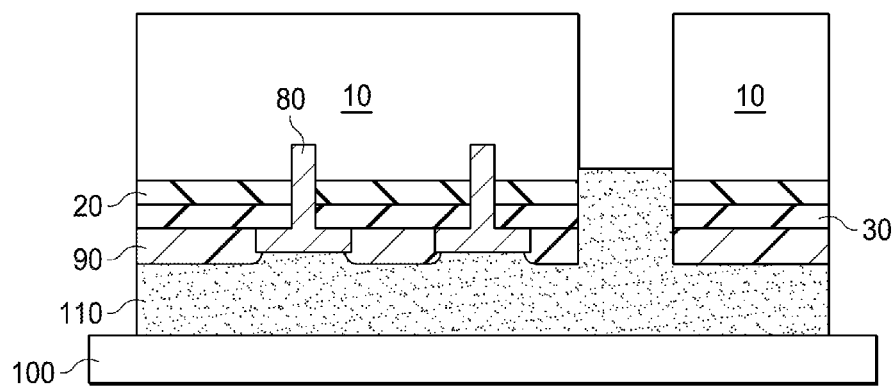

As next illustrated in FIG. 10, the substrate 10 is thinned from the back side exposing the dummy plug 75. Advantageously, the dummy plug 75 supports the plurality of dies 11 along the sidewalls to avoid mechanical failure of the substrate 10 during substrate thinning. This may be particularly important if the dies 11 are small area chips and each wafer has a large number of dies 11 (e.g., about 200,000 to about 500,000).

In various embodiments, the thickness of the substrate 10 after the thinning is about 20 µm to about 100 µm, and 80 µm to about 120 µm in one embodiment. In another embodiment, the thickness of the substrate 10 after the thinning is about 50 µm to about 100 µm. In another embodiment, the thickness of the substrate 10 after the thinning is about 20 µm to about 50 µm. In another embodiment, the thickness of the substrate 10 after the thinning is about 10 µm to about 20 µm. In another embodiment, the thickness of the substrate 10 after the thinning is at least 10 µm. In another embodiment, the thickness of the substrate 10 after the thinning is at least 20 µm. In another embodiment, the thickness of the substrate 10 after the thinning is at least 50 µm. In another embodiment, the thickness of the substrate 10 after the thinning is less than 100 µm. In another embodiment, the thickness of the substrate 10 after the thinning is less than 80 µm. In another embodiment, the thickness of the substrate 10 after the thinning is less than 50 µm. In another embodiment, the thickness of the substrate 10 after the thinning is less than 30 µm. The final thickness of the substrate 10 may be selected based on the mechanical stability, need for reducing resistances, and others.

In various embodiments, the thinning may be performed using a grinding process, a chemical etching, a chemical mechanical etching, and combinations thereof. After the thinning, a back surface of the dummy plug 75 is exposed. The dummy plug 75 is removed using a descum process. In various embodiments, the dummy plug 75 is removed using a plasma process comprising a oxidizing plasma, which oxidizes the dummy fill material 70 of the dummy plug 75. In particular, the dummy plug 75 is removed using a oxygen plasma in one embodiment. In various embodiments, the dummy plug 75 may be removed other oxidizing chemistries including exposure to a oxygen comprising gas, oxidizing etchant.

Figure 11:
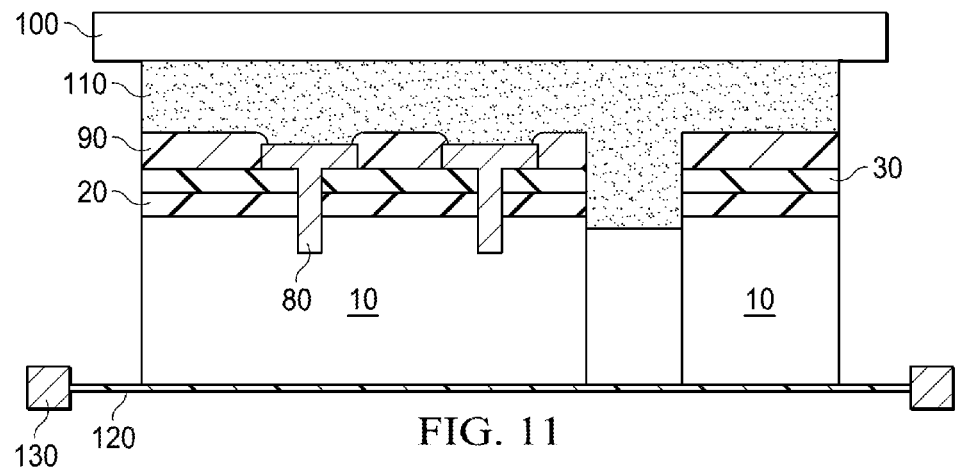

Referring to FIG. 11, the exposed back side of the substrate 10 is placed on a tape 120 and frame 130 and demounted from the carrier 100. The adhesive 110 may be removed using a chemical etch process such as wet etching. In various embodiments, the adhesive 110 may be subjected to a specific treatment to reduce the adhesion force of the adhesive layer 110 to the dies as well as to the carrier 100. Therefore, in some embodiments, a pre-treatment may be performed prior to separating the carrier 100 from the adhesive layer 110. As examples, electromagnetic irradiation may be performed, for example, an infra-red or an ultra violet treatment may be performed in one embodiment. In another example, a heating process may be performed.

Figure 12:
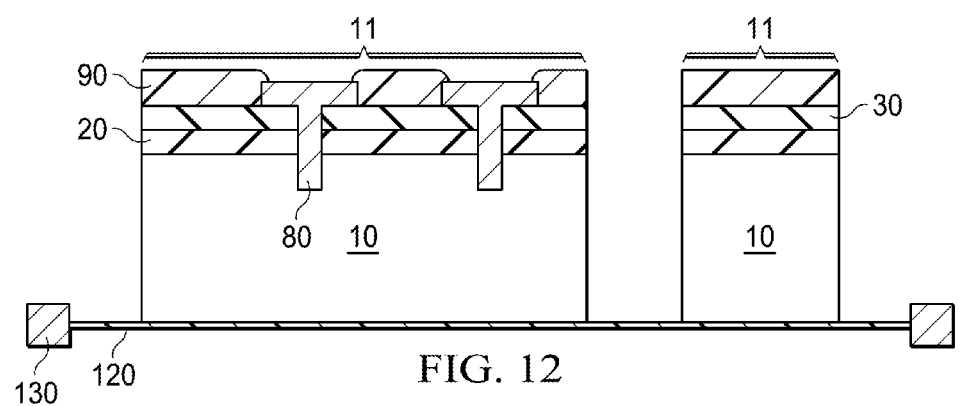

FIG. 12 illustrates the dies after removing the adhesive 110. As the dummy plug 75 was previously removed, the removal of the adhesive 110 results in the formation of singulated dies 11 attached to a tape 120. Conventional semiconductor processing may continue as needed.

Figure 13:
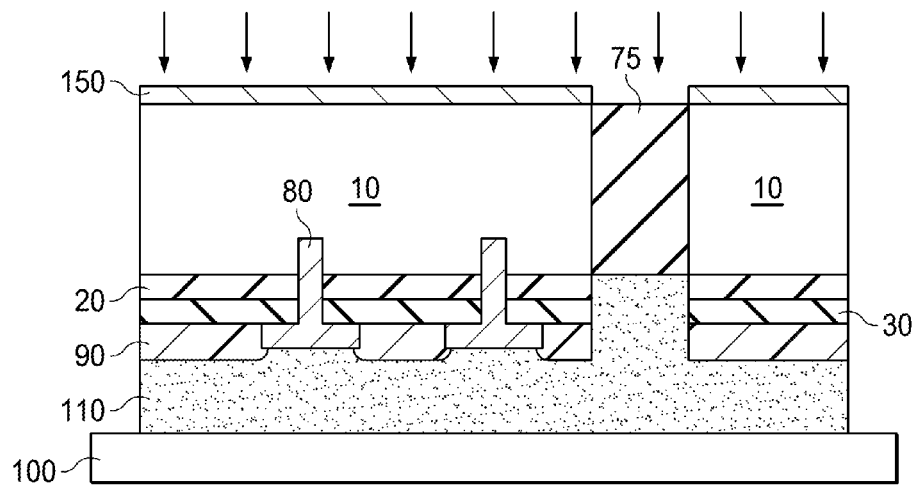
FIGS. 13-15 illustrate a cross-sectional view of a semiconductor device during various stages of fabrication in accordance with an alternative embodiment of the invention, wherein a back side metallization is formed before removing the dummy fill material.
Figure 14:
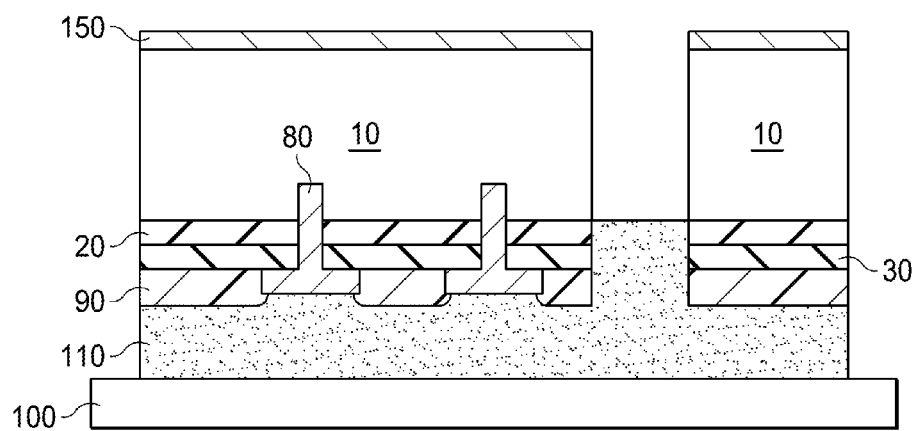
Figure 15:
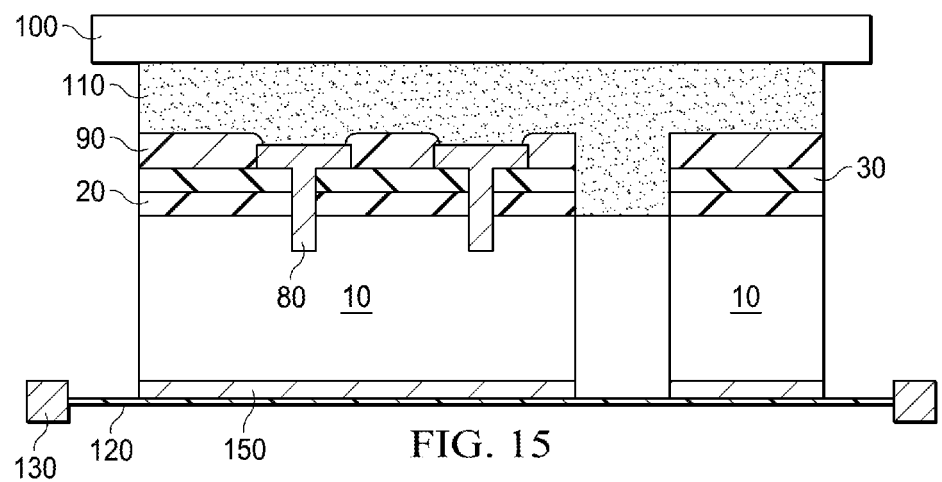

FIGS. 13-15 illustrate a semiconductor device including the formation of back side metallization before removing the dummy fill material in accordance with an alternative embodiment of the invention.

The embodiment described in FIGS. 13-15 includes the formation of back side metallization with the dummy plug protecting the sidewalls of the dies from being metallized. Processing follows as described in prior embodiment with respect to FIGS. 1-9. The back side of the substrate 10 is thinned as described previously exposing the dummy plug 75.

FIG. 13 illustrates a semiconductor device after the formation of back side metallization in accordance with an embodiment of the invention.

Referring to FIG. 13, a back side metallization layer 150 may be deposited over the exposed back side of the substrate 10. The back side metallization layer 150 may comprise a metal layer in one embodiment. The metal layer may contact the substrate 10 directly in one embodiment. The metal layer may comprise an aluminum layer in one embodiment. In another embodiment, the metal layer comprises a copper layer. In various embodiments, the back side metallization layer 150 may comprise metals such as tungsten, titanium, tantalum, or cobalt, a silicide such as tungsten silicide, molybdenum silicide, nickel silicide, titanium silicide, or tantalum silicide.

In various embodiments, the back side metallization layer 150 may comprise a continuous metal layer or a metal layer such as redistribution lines and contact pads embedded within a dielectric layer.

FIG. 14 illustrates a semiconductor device after the removal of the dummy plug 75 in accordance with an embodiment of the invention. As illustrated in FIG. 14, the dummy plug 75 is removed from the exposed back side of the substrate 10. In one embodiment, the dummy plug 75 is removed using a wet etching process. In one or more embodiments, the dummy plug 75 is removed using an oxidizing plasma, e.g., comprising oxygen (see arrows showing the plasma in FIG. 13).

FIG. 15 illustrates a semiconductor device after placing the substrate over a tape and frame in accordance with an embodiment of the invention. The substrate 10 is placed over a tape 120 and frame 130 as described in prior embodiments. The carrier 100 and the adhesive 110 may be removed as described in earlier embodiments.

Figure 16:
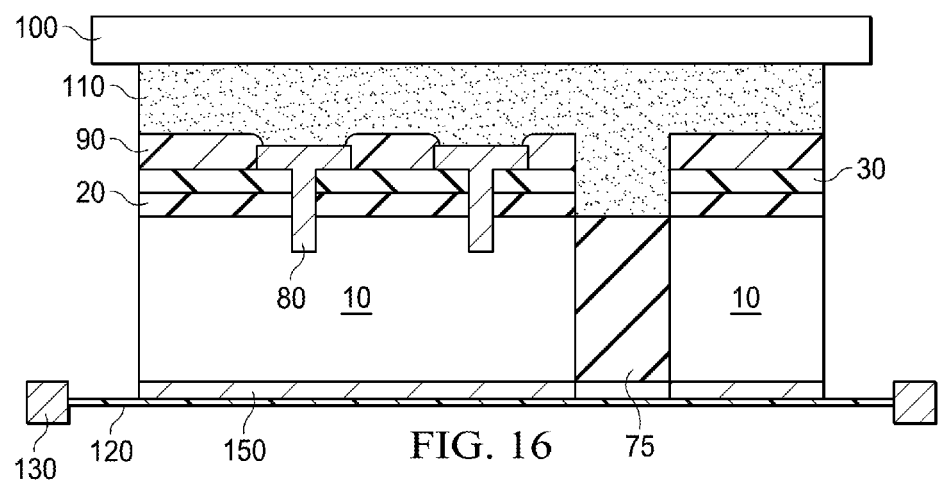
FIGS. 16-17 illustrate a cross-sectional view of a semiconductor device during various stages of fabrication in accordance with an alternative embodiment of the invention, wherein the dummy plug is removed after separating the semiconductor device from the carrier and attaching to a tape and frame.
Figure 17:
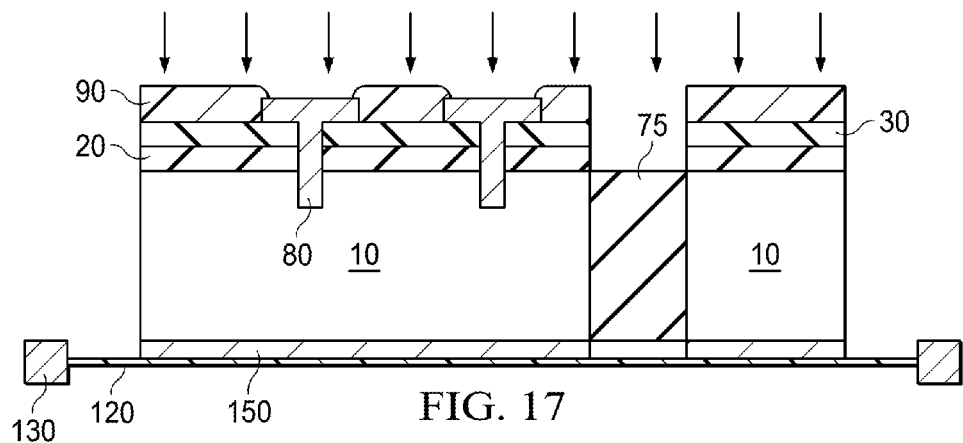

FIGS. 16-17 illustrates an alternative embodiment of forming a semiconductor device, wherein the dummy plug is removed after separating the semiconductor device from the carrier and attaching to a tape and frame.

Processing follows the embodiment described with respect to FIG. 13. Next, unlike the prior embodiment, as illustrated in FIG. 16, the substrate 10 is placed over a tape 120 and frame 130. The carrier 100 and the adhesive 110 are removed as illustrated in FIG. 17. Next, the dummy plug 75 is removed from the top side, for example, using an oxygen plasma (indicated by arrows). This embodiment may be used depending on the ability of the tape 120 to undergo processing as described.

FIGS. 18-26 illustrate an alternative embodiment of forming a semiconductor device, wherein a back side metallization layer is formed after removing the dummy fill material from within the kerf openings 60.

Figure 18:
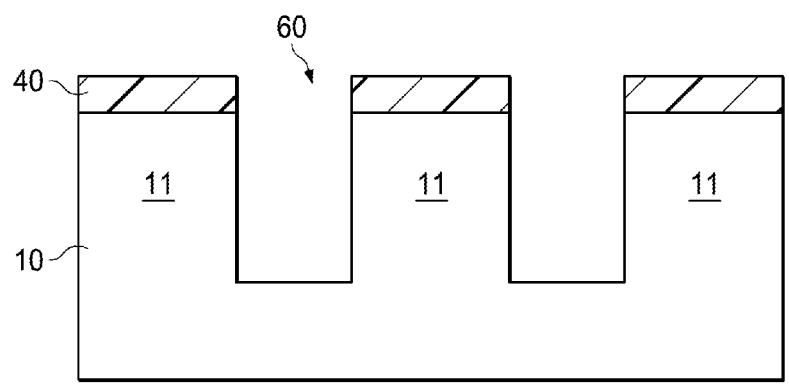
FIGS. 18-26 illustrate a cross-sectional view of a semiconductor device during various stages of fabrication in accordance with an alternative embodiment of the invention, wherein a back side metallization layer is formed after removing the dummy fill material.

FIG. 18 illustrates a substrate 10 having a plurality of kerf openings 60 formed therein. The kerf openings 60 may be formed after forming a first resist 40 to form an etch mask as described previously. The substrate 10 comprises a plurality of dies 11 separated by kerf openings 60.

Figure 19:
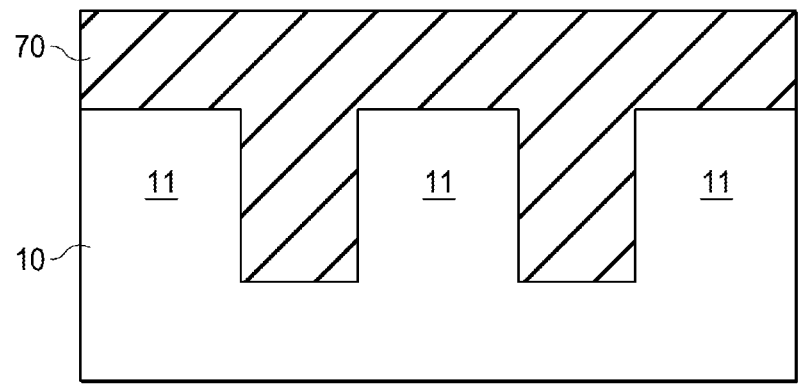
Figure 20:
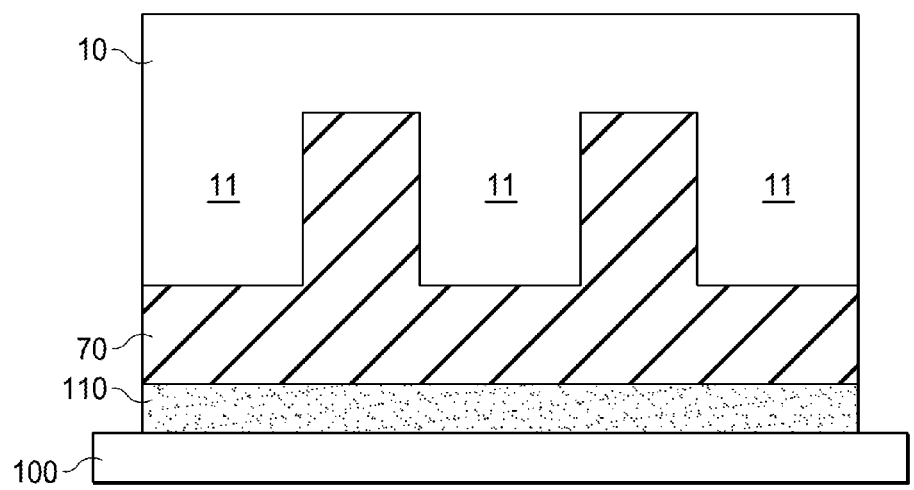

Referring to FIG. 19, a dummy fill material 70 is filled within the kerf openings 60. The dummy fill material 70 may be overfilled in one or more embodiments. As described previously, the dummy fill material 70 may comprise amorphous carbon in one or more embodiments including amorphous fluorinated carbon. Referring next to FIG. 20, the substrate 10 is attached to a carrier 100 through an adhesive 110 as discussed in prior embodiments.

Figure 21:
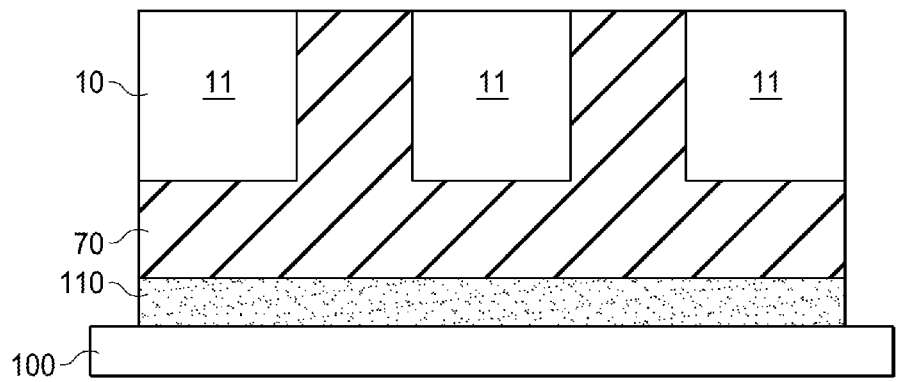
Figure 22:
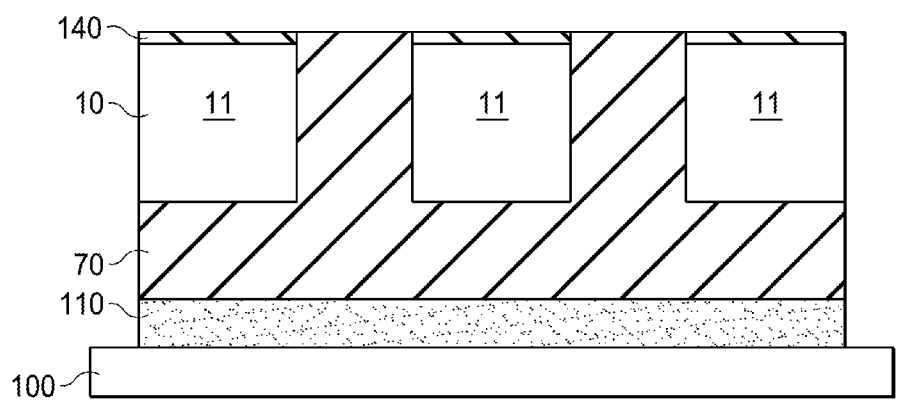

The substrate 10 is thinned from the back side as shown in FIG. 21. The thinning may be mechanical, chemical, chemical mechanical polishing and/or combinations thereof. The exposed back side of the substrate 10 is doped to form a doped layer 140 (FIG. 22). The doping type may be chosen to form appropriate contact, for example, based on the doping of the substrate 10.

Figure 23:
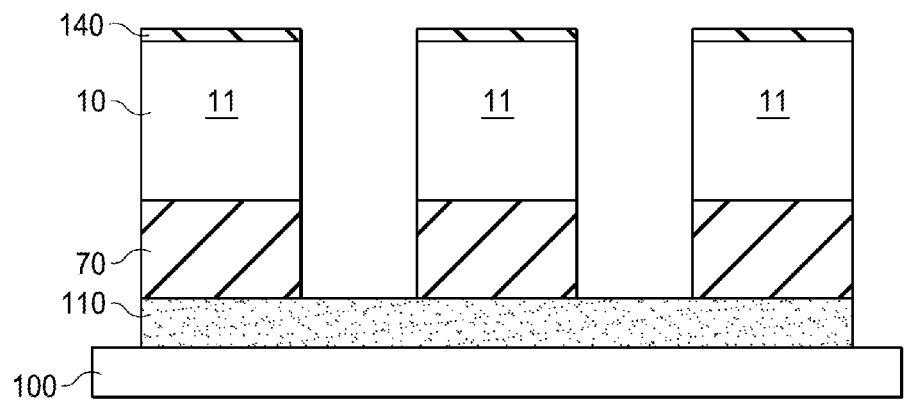

Referring to FIG. 23, the exposed portion of the dummy fill material 70 within the kerf openings 60 is removed. In one or more embodiments, the dummy fill material 70 may be etched using an oxidizing plasma such as a descum process. In alternative embodiments, a wet etching process may be used to remove the dummy fill material 70. Thus, a plurality of dies 11 are formed because the dummy fill material 70 holding the plurality of dies 11 together is removed.

Figure 24:
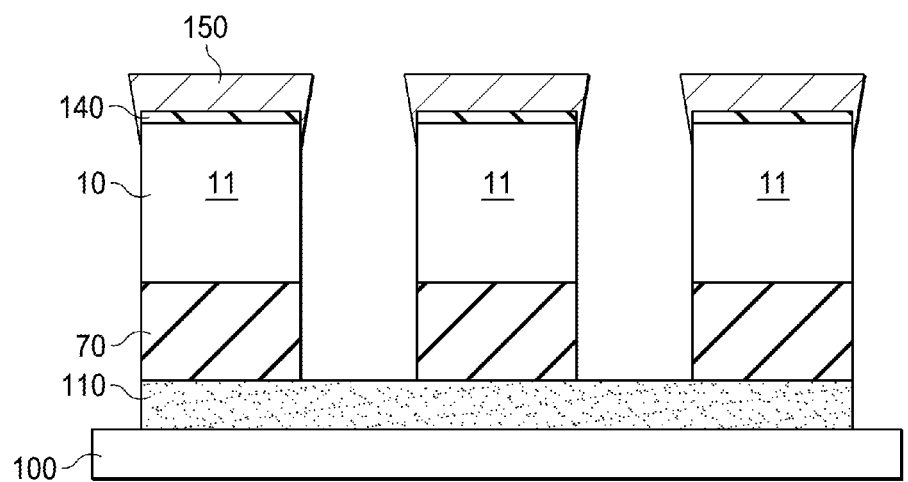

A back side metallization layer 150 is deposited over the back side of the plurality of dies 11 as illustrated in FIG. 24. The back side metallization layer 150 may comprise a metal layer such as an aluminum layer or a copper layer as described in earlier embodiments. The back side metallization layer 150 may be deposited using a sputter deposition process, vapor deposition process, chemical vapor deposition process, plasma vapor deposition process, damascene process, electroplating, electro-less plating, combinations thereof, and others. In various embodiments, a metal layer of the back side metallization layer 150 contacts the doped layer 140 thereby forming a low resistance ohmic contact. In one embodiment, the back side metallization layer 150 may be formed as a silicide by depositing a silicide source metal such as nickel, tungsten, cobalt, titanium, tantalum, and others over the back side of the plurality of dies 11. The plurality of dies 11 are heated so as to form a silicide layer after which excess silicide source metal may be removed.

Figure 25:
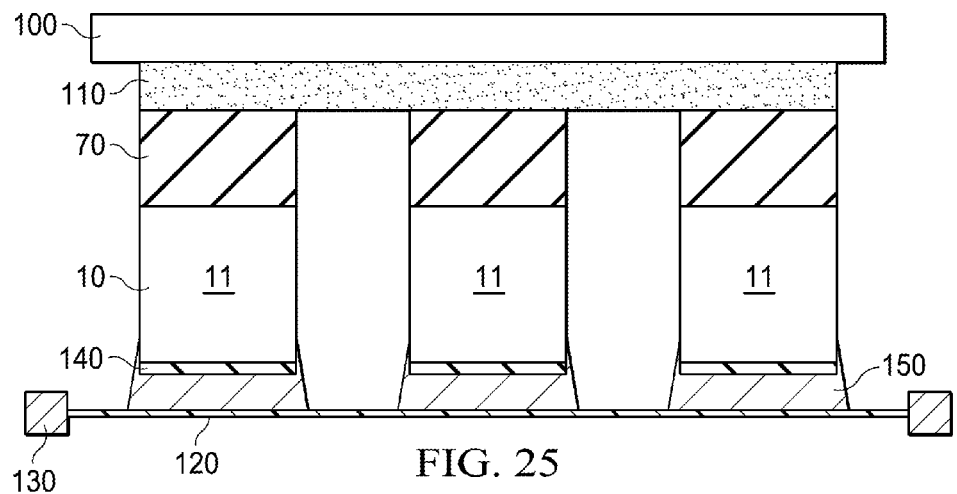
Figure 26:
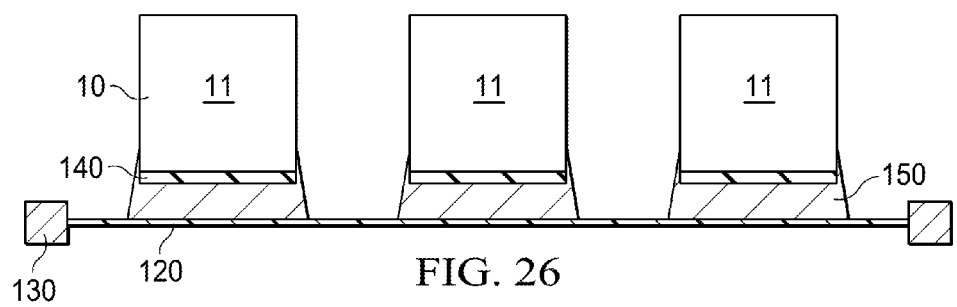

Referring to FIG. 25, the carrier 100 holding the plurality of dies 11 is placed over a tape 120 and frame 130. As illustrated, the back side metallization layer 150 may contact the tape 120 in one embodiment. As next illustrated in FIG. 26, the carrier 100 and the adhesive 110 may be removed as described previously.

Figure 27:
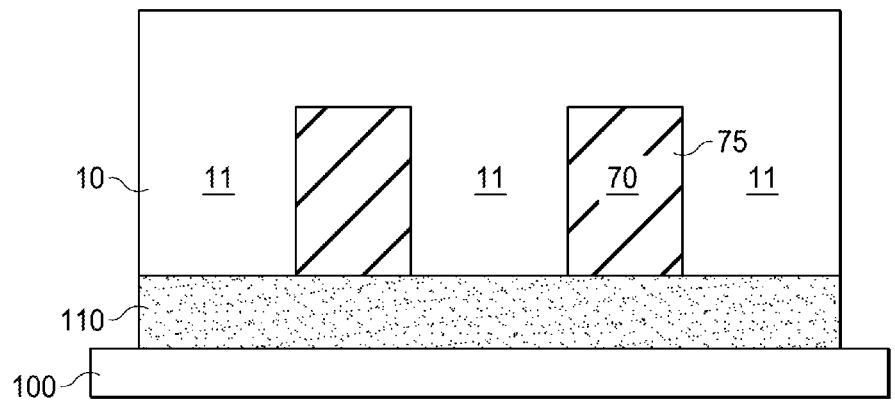
FIGS. 27-28 illustrate another embodiment of forming a semiconductor device having back side metallization, wherein the dummy fill material is formed as a dummy plug.
Figure 28:
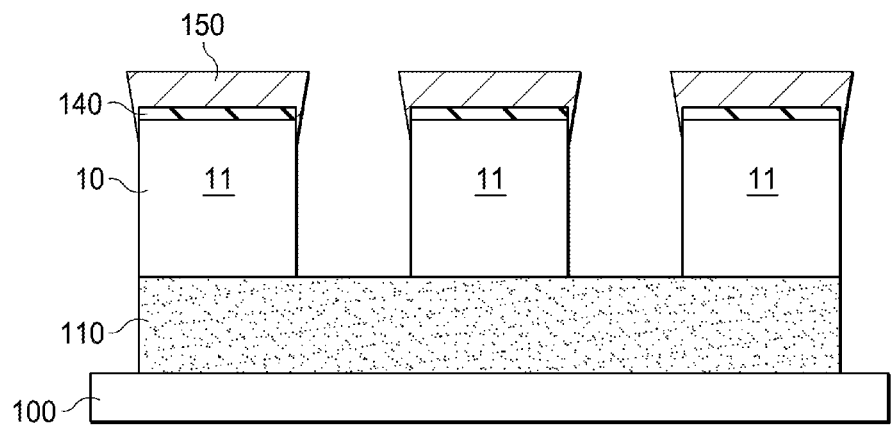

FIGS. 27-28 illustrate another embodiment of forming a semiconductor device having back side metallization, wherein the dummy fill material is formed as a dummy plug.

This embodiment follows the description of the prior embodiment as shown in FIGS. 18 and 19. Next, referring to FIG. 27, a dummy plug 75 is formed within the kerf regions of the substrate 10. As described with respect to FIG. 6, the overfilled portion of the dummy fill material 70 is removed, for example, etched back using a timed etch.

Subsequent processing follows as described in FIGS. 20-24 (attaching to carrier 100 with adhesive 110, thinning the substrate 10, forming a doped layer 140, etching the dummy fill material 70 in the kerf openings 60, and forming a back side metallization layer 150), which results in the structure shown in FIG. 28. As described with respect to FIGS. 25 and 26, the plurality of dies 11 are placed over a tape and frame after which the carrier 100 and the adhesive 110 are removed.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-12, FIGS. 13-15, FIGS. 16-17, FIGS. 18-26, and FIGS. 27-28 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a plurality of active elements in a semiconductor substrate having a first side and an opposite second side, the plurality of active elements being formed adjacent the first side;
   forming metallization, at the first side, over the plurality of active elements to form a plurality of devices;
   forming openings in the semiconductor substrate, the openings surrounding each of the plurality of devices; and
   forming a dummy plug within the openings;
   providing a tape over the opposite second side of the semiconductor substrate;
   providing a frame and an adhesive covering the first side of the semiconductor substrate,
   wherein a portion of the adhesive is disposed within the openings covering the dummy plug; and
   singulating the semiconductor substrate
      by removing the frame and the adhesive and
      followed by removing the dummy plug in the openings from the first side of the semiconductor substrate.

2. The method of claim 1, wherein the openings comprise a mesh like shape.

3. The method of claim 1, wherein each of the plurality of devices comprise an integrated circuit.

4. The method of claim 1, wherein the plurality of active elements comprises transistors.

5. The method of claim 1, further comprising:
   thinning the semiconductor substrate to expose the dummy plugs.

6. The method of claim 1, wherein the dummy plug comprises amorphous carbon.

7. The method of claim 6, wherein the amorphous carbon comprises tetrahedral amorphous carbon.

8. The method of claim 6, wherein the amorphous carbon comprises hydrogenated amorphous carbon.

9. The method of claim 1, wherein the dummy plug comprises carbon and fluorine.

10. The method of claim 1, wherein the dummy plug comprises nanostructured carbon.

11. The method of claim 1, wherein the dummy plug comprises polycrystalline carbon.

12. The method of claim 1, wherein the dummy plug comprises at least 90% carbon.

13. The method of claim 1, wherein removing the dummy plug comprises using an oxidizing plasma process.

14. The method of claim 1, wherein the adhesive is removed using a wet etching process and the dummy plug is removed using an oxygen plasma process.

15. A method of forming a semiconductor device, the method comprising:
  forming openings in a substrate;
  forming a dummy fill material within the openings;
  forming an adhesive
    covering a top surface of the substrate,
    wherein a portion of the adhesive is disposed within the openings covering the dummy fill material;
  attaching the substrate to a carrier through the adhesive;
  thinning the substrate to expose the dummy fill material in the openings;
  placing a bottom surface of the substrate over a tape;
  removing the carrier and adhesive after placing the substrate over the tape; and
  singulating the substrate by removing the dummy fill material in the openings,
  wherein the dummy fill material is removed after removing the carrier and the adhesive.

16. The method of claim 15, wherein the substrate comprises a plurality of dies adjacent a front side than an opposite back side.

17. The method of claim 15, further comprising forming a back side metallization layer after thinning the substrate but before removing the dummy fill material.

18. The method of claim 15, further comprising forming active regions adjacent a front side of the substrate and forming metallization layer over the active regions.

19. The method of claim 15, wherein removing the dummy fill material comprises using an oxidizing plasma process.

20. A method of forming a semiconductor device, the method comprising:
  forming openings in a substrate;
  forming a dummy fill material within the openings;
  forming a dummy plug
    by removing the dummy fill material from over a top surface of the substrate
    before thinning the substrate;
  providing a frame and an adhesive
    covering the top surface of the substrate,
    wherein a portion of the adhesive is disposed within the openings covering the dummy plug;
  thinning the substrate to expose the dummy fill material in the openings;
  placing a tape over a bottom surface of the substrate; and
  singulating the substrate
    by removing the frame and the adhesive and
    followed by removing the dummy fill material in the openings.

21. The method of claim 20, wherein forming the openings comprises:
  forming a masking layer over the substrate;
  forming an etch mask by patterning the masking layer; and
  etching the substrate using the etch mask.

22. The method of claim 21, wherein etching the substrate using the etch mask comprising using a oxidizing plasma process.

* * * * *